(12) United States Patent
Xiu (10) Patent No.: US 8,120,389 B2
(45) Date of Patent: Feb. 21, 2012

(54) DIGITAL TO FREQUENCY SYNTHESIS USING FLYING-ADDER WITH DITHERED COMMAND INPUT

(75) Inventor: Liming Xiu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/536,181

(22) Filed: Aug. 5, 2009
(Under 37 CFR 1.47)

(65) Prior Publication Data
US 2011/0285439 A1    Nov. 24, 2011

Related U.S. Application Data

(60) Provisional application No. 61/086,267, filed on Aug. 5, 2008.

(51) Int. Cl.
*H03B 21/00* (2006.01)
*H03L 7/06* (2006.01)

(52) U.S. Cl. ........ 327/105; 327/107; 327/156; 327/159; 331/1 A; 331/45; 331/74; 375/354; 375/365; 375/376; 708/271

(58) Field of Classification Search .......... 327/105–107, 327/147, 150, 156, 159; 331/1 A, 45, 74; 375/354, 355, 362, 365, 373, 376; 708/270–272
See application file for complete search history.

(56) References Cited

U.S. PATENT DOCUMENTS

| | | | | |
|---|---|---|---|---|
| 6,329,850 | B1 * | 12/2001 | Mair et al. | 327/107 |
| 7,065,172 | B2 * | 6/2006 | Xiu et al. | 375/376 |
| 7,772,893 | B2 * | 8/2010 | Chen et al. | 327/105 |
| 2009/0103604 | A1 * | 4/2009 | Xiu et al. | 375/240.01 |
| 2009/0160493 | A1 * | 6/2009 | You et al. | 327/105 |

OTHER PUBLICATIONS

Mair, H.; Liming Xiu; , "An architecture of high-performance frequency and phase synthesis ," Solid-State Circuits, IEEE Journal of , vol. 35, No. 6, pp. 835-846, Jun. 2000.*
Gharaee, H.; Tathesari, E.; , "A New High Resolution Frequency and Phase Synthesis Method based on 'Flying-Adder' Architecture," Semiconductor Electronics, 2006. ICSE '06. IEEE International Conference on , vol., no., pp. 520-523, Oct. 29, 2006-Dec. 1, 2006.*
Liming Xiu; , "The concept of time-average-frequency and mathematical analysis of flying-adder frequency synthesis architecture," Circuits and Systems Magazine, IEEE , vol. 8, No. 3, pp. 27-51, Third Quarter 2008.*

* cited by examiner

*Primary Examiner* — Patrick O'Neill
(74) *Attorney, Agent, or Firm* — Robert D. Marshall, Jr.; W. James Brady; Frederick J. Telecky, Jr.

(57) ABSTRACT

To make Flying-Adder architecture even more powerful, a new concept, time-average-frequency, is incorporated into the clock generation circuitry. This is a fundamental breakthrough since it attacks the clock generation problem from its root: how is the clock signal used in real systems? By investigating from this direction, a much more powerful architecture, fixed-VCO-Flying-Adder architecture, is created. Furthermore, based on fixed-VCO-Flying-Adder frequency synthesizer and time-average-frequency, a new type of component called Digital-to-Frequency Converter (DFC) is born.

14 Claims, 5 Drawing Sheets

DIGITAL TO FREQUENCY SYNTHESIS USING FLYING-ADDER WITH DITHERED COMMAND INPUT

CLAIM OF PRIORITY

This application claims priority under 35 U.S.C. 119(e)(1) to U.S. Provisional Application No. 61/086,267 filed Aug. 5, 2008.

TECHNICAL FIELD OF THE INVENTION

The technical field of this invention is clock signal generation on integrated circuits.

BACKGROUND OF THE INVENTION

In most modern electronic devices activities inside the integrated circuits are coordinated by on-chip clock signals of various frequencies. This is especially true for large System-on-Chip (SoC) integrated circuits where large numbers of functions are integrated inside a single chip and each function has its unique clock frequency requirement. The on-chip frequencies are usually generated by Phase Lock Loop (PLL). The PLLs is the heart of the integrated circuit controlling all operations. PLLs have known disadvantages. The frequencies synthesisable by PLLs are limited. PLLs have high design complexity including heavy analog content. PLLs have response speed that is not instantaneous.

Flying-Adder architecture is a novel technique for generating clock signals on an integrated circuit. This architecture can solve many difficult problems in various commercial projects. The character of this architecture can be summarized as a circuit level enabler which enables system level innovations.

The information is collected through the sensors which converts the real world physical phenomena generally into voltage or current. An analog-to-digital converter (ADC) is employed to transfer the information into digital format for processing. After processing, the signal is converted back to voltage or current via a digital-to-analog converter (DAC) to control the real world activities. In this approach, the magnitude of the signal in voltage or current is the information. ADC and DAC are used to quantify the information. Many real world phenomena are more naturally suitable for rate of switching representation. Using this representation requires a frequency-to-digital converter (FDC) and a digital-to-frequency converter (DFC). A FDC is easily constructed using known techniques. This invention provides a circuit level enabler for a DFC.

SUMMARY OF THE INVENTION

To make Flying-Adder architecture even more powerful, a new concept, time-average-frequency, is incorporated into the clock generation circuitry. This is a fundamental breakthrough since it attacks the clock generation problem from its root: how is the clock signal used in real systems? By investigating from this direction, a much more powerful architecture, fixed-VCO-Flying-Adder architecture, is created. Furthermore, based on fixed-VCO-Flying-Adder frequency synthesizer and time-average-frequency, a new type of component called Digital-to-Frequency Converter (DFC) is born.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
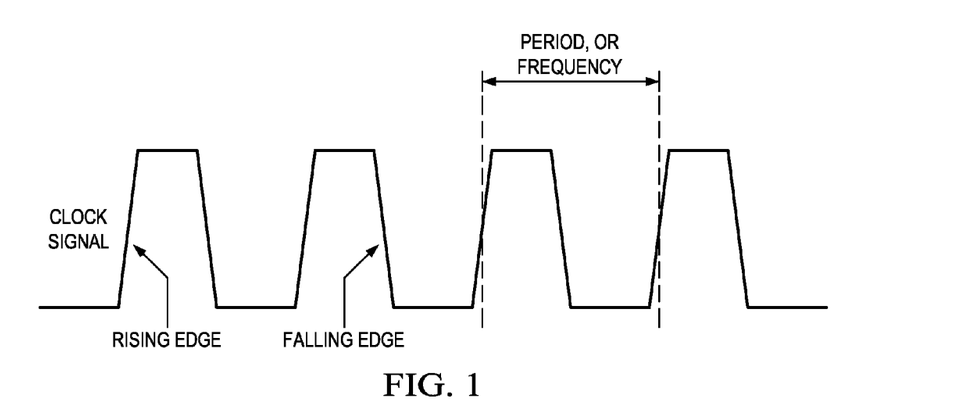
FIG. 1 illustrates a generic waveform of clock signal typically used in electronic devices.

FIG. 1 illustrates a generic waveform of clock signal 100 typically used in electronic devices. The waveform of the clock signal has a defined pattern which repeats itself indefinitely. This defined pattern has two, and only two, distinguishable voltage levels. This first voltage level is regarded as high and the second voltage level is regarded as low. The defined pattern has one rising edge 101 which is an intermediate state when the signal transits from its low voltage level to high voltage level. The defined pattern also has one falling edge 102 that is the intermediate state when the signal transits from high to low level.

Within a given time interval, such as one second, the number of times that the defined pattern repeats is defined as the frequency of this clock signal f. The time required to complete one such defined pattern is the period 110 of this clock signal T. By definition $T=1/f$.

The rising edge 101 and the falling edge 102 are often called events. Their occurrences indicate something has happened within the electronic system. In most of modern electronic systems of the type known as synchronous systems, all internal activities are coordinated by these clock events, either rising edge 101, falling edge 102 or both. The clock signals 100 are usually generated by on-chip component called PLL. This PLL produces other frequencies from a reference frequency. Generation of clock signal 100 is referred as frequency synthesis.

A key requirement of clock generation, implied by the above definition, is that all the active patterns (called cycles) must have same period T. In VLSI circuit design practice, this feature can ease the chip implementation task greatly. However, this requirement also makes the clock generation circuitry (PLL) one of the most difficult components to design and built.

As mentioned above, the requirement of all the clock cycles 100 must have the same period T has made clock circuitry design difficult. If this requirement could be removed, it can lead to a completely new direction. This invention uses the concept of time-average-frequency. The waveform of the clock signal is composed of infinite number of cycles. This first voltage level is regarded as high and the second voltage level is regarded as low. The defined pattern has one rising edge 101 and one falling edge 102. Within a given time interval, such as one second, the number of cycles is the time-average-frequency of this clock signal f. Between any two adjacent rising edges 101 or falling edges 102, the time is defined as the instant period T. The magnitude of the instant period T of each cycle is either controllable or known by the designer.

This definition does not require repeatability. Thus every cycle need not have the same period. However, both definitions define the frequency of the clock signal. In traditional clock definition, the frequency is the number of repeatable pattern within one second. In the alternative definition, the frequency is the number of cycles within one second. Structurally, each cycle contains one rising edge 101 and one falling edge 102. When used as a trigger signal within an electronic system, they both achieve the same end result of coordinating the activities inside the chip.

On comparing the two clock signal definitions, clock signal having a repeatable pattern is ideal for driving an electronic system. This is due to the fact that every rising edge 101 and falling edge 102 is predictable. This can greatly simplify chip implementation. On the other hand, cycle of time-average-frequency is less effective when used as the driver of electronic system since it lacks the predictability. If constructed carefully with controlled predictability, the alternative cycle can be safely used in electronic systems.

When clock signal is used in electronic systems, its frequency controls the number of operations carried out within the time interval of one second. As long as the specified number of operations per second is guaranteed, the electronic system cannot tell the difference between frequency and time-average-frequency.

Figure 2:
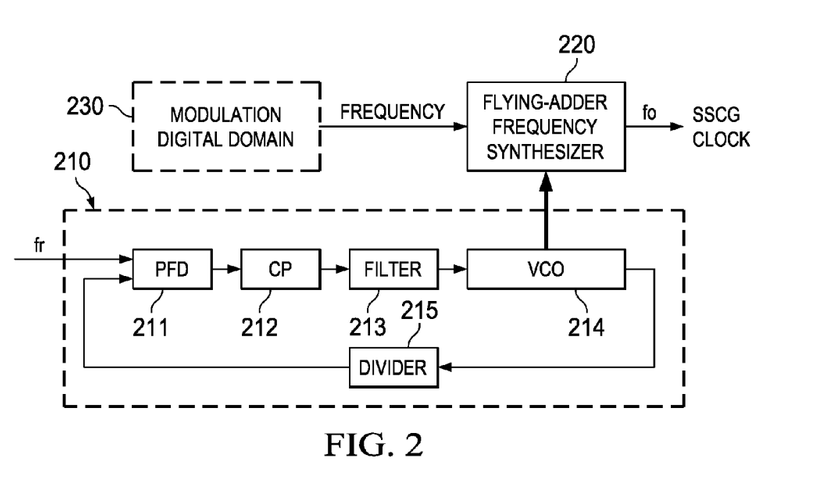
FIG. 2 illustrates the clock generation circuit of this invention.

FIG. 2 illustrates the clock generation circuit of this invention. This clock generation circuit includes PLL 210. PLL 210 includes phase detector (PFD) 211, charge pump (CP) 212, filter 213, voltage controlled oscillator (VCO) 214 and divider 215 which divides by N. Divider 215 adjusts the frequency relationship between an input reference frequency $f_r$ and the output frequency $f_o$ of VCO 214. Input reference frequency $f_r$ is generally determined by a piezoelectric crystal frequency oscillator. PFD 211 compares the phases of input reference frequency $f_r$ and the /N signal from divider 215 and produces an error signal. CP 212 and filter 213 generate a control signal for VCO 214 from the phase error signal output from PFD 211. Feedback of an output signal from VCO 215 enables phase locked loop 210 to reliably generate an output signal having a stable frequency relationship to the input reference frequency $f_r$.

Figure 3:
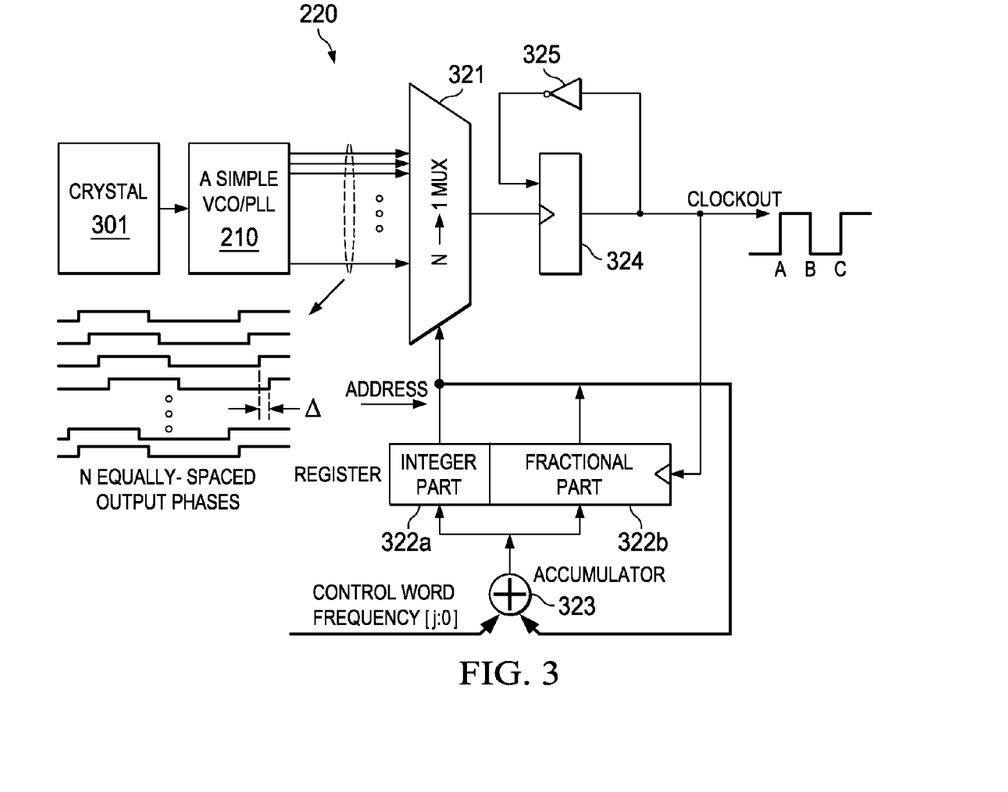
FIG. 3 illustrates the flying-adder frequency synthesizer illustrated in FIG. 2.

As better illustrated in FIG. 3, VCO 215 generates a plurality of signals L preferably equally spaced in phase. It is typical to generate these signals L using a chain of delays. Flying-adder synthesizer 220 receives the plural signals L and a digital control word FREQ. Flying-adder synthesizer 220 generates an output signal fs that depends both upon the frequency of plural signals L and the value of digital control word FREQ. This output signal fs supplies the clock driven process of the electronic circuit.

FIG. 3 illustrates an example flying-adder synthesized such as used in this invention. Piezoelectric crystal 301 provides a stable frequency standard for VCO/PLL 210 illustrated in FIG. 3. FIG. 3 illustrates VCO/PLL 210 producing N equally spaced output signals having a phase spacing of Δ. These N equally spaces output signals correspond to plural signals L illustrated in FIG. 3.

These equally spaced output signals supply respective inputs of N to 1 multiplexer 321. The selection made by N to 1 multiplexer 321 is controlled by integer part 322*a* of register 322. The selected output of N to 1 multiplexer 321 supplies the clock input of flip-flop 324. Each positive going edge of this output toggles flip-flop 324 to an opposite digital output producing a square wave signal CLKOUT having a controlled frequency. Inverter 325 is coupled to flip-flop 324 to retain its state between clock pulses.

Accumulator 323 adds the current contents of register 322 including an integer part stored in integer part register 322*a* and a fractional part stored in fractional part register 322*b* to the digital control word FREQ. If the sum overflows, the most significant bit is discarded. The sum produced by accumulator 323 is stored in register 322 at a time controlled by CLKOUT from flip-flop 324. Each time the sum is loaded into register 322 the number stored in integer part 322*a* selects an input to N to 1 multiplexer 321. The repeated selection of inputs to N to 1 multiplexer 321 and flip-flop 324 produce the desired clock signal CLKOUT.

Figure 4:
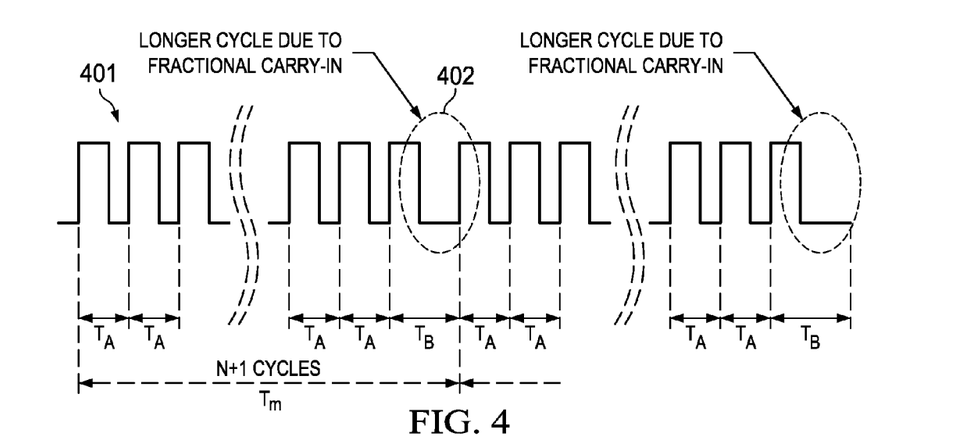
FIG. 4 illustrates an example of the clock signal produced by the flying-adder frequency synthesizer of FIG. 3.

The flying-adder synthesizer operates as follows. Suppose the digital value FREQ equals N, the number of inputs to N to 1 multiplexer 321. Then every addition within accumulator 323 will over flow to the same integral part. Thus the same input to N to 1 multiplexer 321 will be selected repeatedly. According the frequency of CLKOUT will equal the input frequency from VCO/PLL 210 with a phase dependent upon the initial condition of register 322. If the digital control word FREQ is larger than N, the input selected will tend to move within N to 1 multiplexer 321 selecting a phase with a longer delay each cycle. This produces a longer pulse period and hence a lower frequency. If the digital control word FREQ is smaller than N, the input selected will tend to move within N to 1 multiplexer 321 selecting a phase with a shorter delay each cycle. This produces a shorter pulse period and hence a higher frequency. The fractional part of FREQ provides additional resolution. Assuming the value of FREQ is constant, continual addition of the fractional causes periodic over flow into the integer part. This causes the input of N to 1 multiplexer 321 to dither between two adjacent intervals as illustrated in FIG. 4. As shown in FIG. 4, the clock generation circuit produces pulses 401 having a period $T_A$ for cycles where the factional part addition does not overflow into the integral part. The clock generation circuit produces pulses 402 having a period $T_B$ for cycles where the factional part addition overflows into the integral part. The rate of selection of the two adjacent intervals corresponds to the magnitude of the fractional part. A small fractional part near 0 will most often select the smaller interval 401 and select the larger interval 402 infrequently. A large fractional part near 1 will select the larger interval 402 more often than selecting the smaller interval 401. A change in the digital value of control word FREQ will be immediately reflected in the next input of N to 1 multiplexer 321. Thus there is no delay in changing frequencies.

Since one type-B cycle occurs once in each time-window of $T_m$, $T_m = 1/f_m = 2\pi/\omega_m$ can also be viewed as modulation frequency if this problem is treated as a carrier frequency being modulated by a modulation frequency. In other words, type-B (or type-A) cycle modulates the synthesizer's output signal at the rate of $f_m$. In some applications the spurious signals can cause concerns on system operation. In most of those cases, converting spurs to noise can clear the application issue. This invention performs this task using the Flying-Adder architecture. This invention adds modulation into the fraction part of the frequency control word FREQ.

Figure 5:
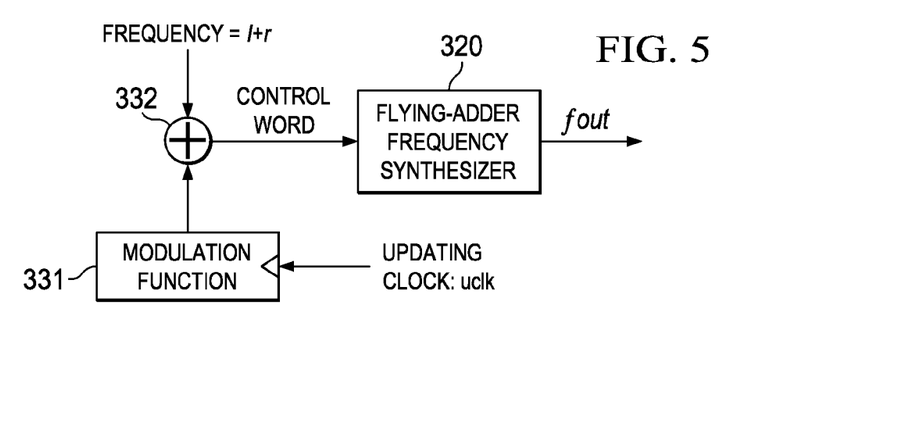
FIG. 5 illustrates modulation of the input control word FREQ according to this invention.

FIG. 5 illustrates this aspect of the invention. An input control word FREQ includes integral part I and fractional part r. Modulation function 331 generates a time varying modulation function. This time varying modulation function is updated at the rate of an updating clock uclk. Adder 332 adds the input control word FREQ and the output of modulation function 331. This produces a dithered control word input to flying-adder frequency synthesizer 320 as illustrated in FIG. 3. The modulation function could be a random number, a saw tooth function or a triangular function.

Figure 6:
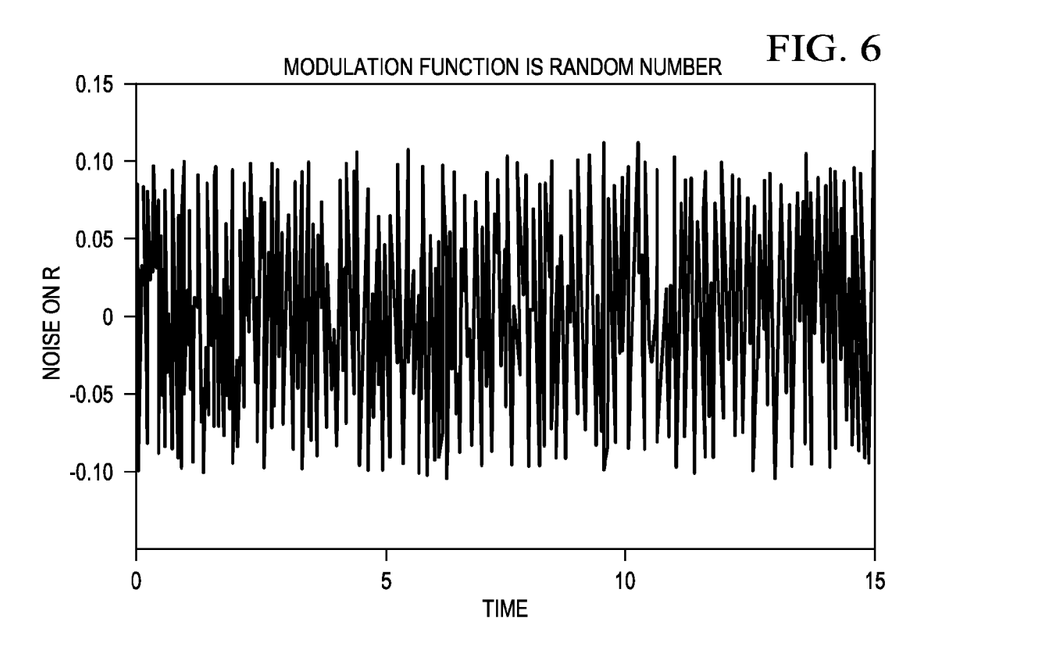
FIG. 6 is an example of a random number modulation function.

The random number technique generates a random number between [−r, r] and adds it to FREQ at a predetermined clock rate uclk. FIG. 6 is an example of random numbers generated by a random number generator for r=0.1. The random numbers have been added to the FREQ at the rate of uclk=$f_{out}$/2. Other uclk rates are feasible and provide similar results.

Figure 7:
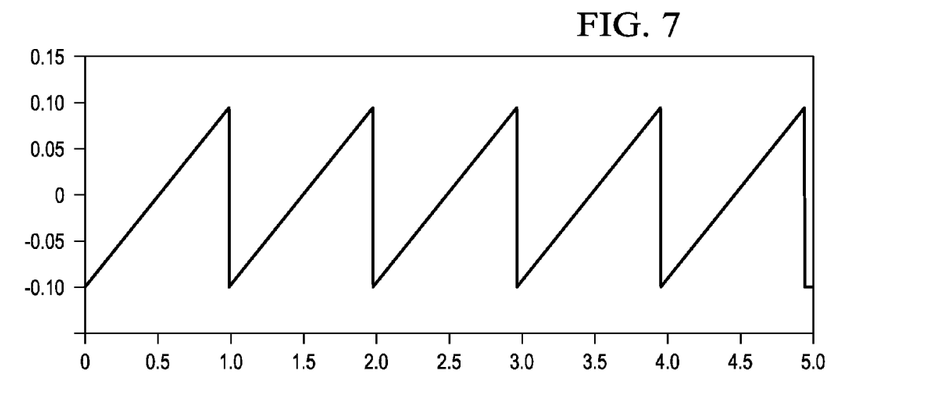
FIG. 7 is an example of a saw tooth wave modulation function.

FIG. 7 is the saw tooth function that may be applied to FREQ. There are three tunable variables for this saw tooth function. These are: the update clock rate uclk; the step size of the saw tooth function; and the full size (height) of the saw tooth function. The saw tooth function may be realized by a k-bit counter. The step size is $r/(2^k-1)$.

Figure 8:
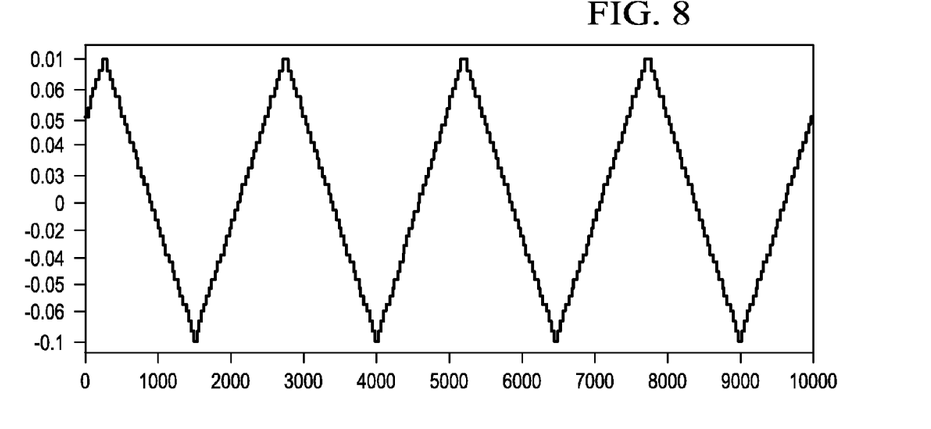
FIG. 8 is an example of a triangle wave modulation function.

FIG. 8 is triangular wave that may be applied to FREQ. Triangular waves have tunable variables similar to saw tooth waves.

In all the three modulation methods, the DC component of the modulation function should be zero to not alter the average frequency. Further, the clock waveform still only contains two types of cycles: type-A of I*Δ and type-B of (I+1)*Δ such that it behaves the same as the un-modulated signal when driving digital circuit. However, the pattern of type-B cycle occurrences changes. Without modulation, type-B cycles will occur regularly as the result of addition which happens at the regular rate. With random numbers added, these events are randomized.

For the cases of a saw tooth wave and a triangular-wave, the original pattern of type-B cycle occurrence is also altered in a controlled way. There are three control variables: the full size of the counter for the modulation function which does not have to be the fractional part r; the step size; and the update rate.

Another benefit of these methods (random, saw tooth, and triangular) in real circuit design practices is that they can help to cure some problems caused by unknown problems. For example, if the end system is found to bear some unwanted spurs whose cause is unknown reasons (such as layout mismatch inside the chip, interference from neighbors or board issue), a controlled noise can be added on FREQ to convert the spurs to noise. No costly hardware modification is needed; it only requires software adjustment to turn it on.

Spread spectrum is a very important subject in modern electronic system design. The key issue in this problem is to spread the highly concentrated clock energy to a slightly boarder range so that the electromagnetic interference between the electronic devices can be reduced. This issue is important because our life is filled with more and more electronic devices (cell phone, iPod, TV, computer and etc). This issue is difficult because the goal of spreading clock energy directly conflicts with the repeatability required in clock definition. As a result, large amount of research and design work has been carried out in this area to cope with this hard problem. Prior art techniques either modulate the VCO or dither the divider to alter the output frequency. This process is a mainly analog process and is very difficult to work because the VCO is one of the most complicated analog components. Thus the prior art spread spectrum techniques have two main drawbacks difficult construction and inaccurate result.

The modulate control word technique illustrated in FIG. 5 is readily adaptable for the spread spectrum application. Using a time-average-frequency can ease the clock generation (frequency synthesis) task. This invention naturally spreads the clock energy. Flying-Adder architecture is the tool which turns this theoretically superior idea into reality. Using Flying-Adder architecture in a spread spectrum clock simplifies the implementation and provides much better performance. Key parameters in constructing a spread spectrum clock include modulation depth (percentage) and modulation method (down spread, center spread, etc). Unlike conventional approaches, these parameters can all be precisely controlled through modulation magnitude, modulation rate of Flying-Adder modulator since they are digital values. And more importantly these digital values influence on the output frequency is linear in the case of Flying-Adder architecture. Moreover, the VCO is always used in fixed state. This permits a significant reduction in the design complexity. Furthermore, when Flying-Adder spread spectrum modulator is used, the resulting clock signal only has two types of cycle: type-A and type-B. Its impact on the driven digital circuitry is known and easily controlled. In other words, this is the controlled noise. The traditional approaches of adding noise is generally uncontrollable in construction and unpredictable in application. Spread spectrum function can by employed using the above described techniques using a larger modulation magnitude.

The Flying-Adder spread spectrum clock generator is so powerful that even a software version can be workable. That is, the digital modulation pattern can be applied by on-chip processor through software changes to control word FREQ. Technically, the modulation pattern can be applied by interrupts to CPU.

Figure 9:
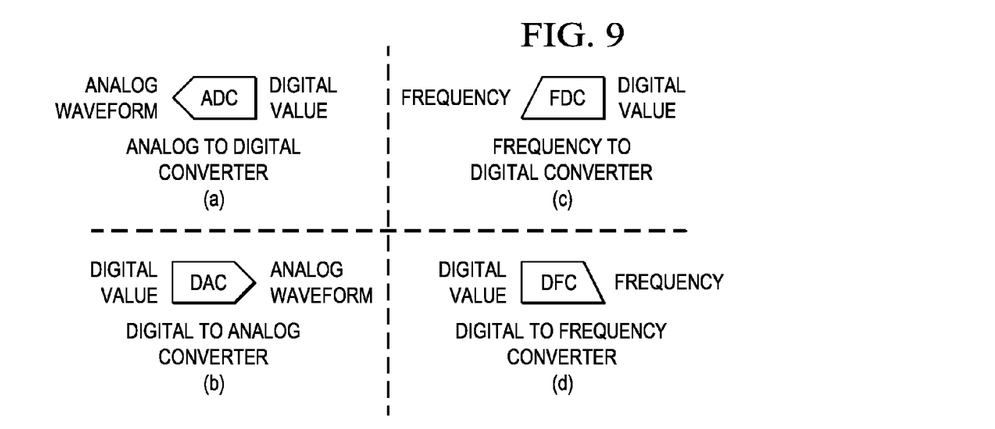
FIG. 9 illustrates a comparison of circuits used in magnitude signal representation and circuits used in rate-of-switching signal representation.

The Flying-Adder architecture and the time-average-frequency are support a Digital-to-Frequency Converter (DFC). FIG. 9 illustrates the importance of the DFC. FIG. 9(a) illustrates an analog-to-digital converter (ADC) which receives an analog input signal and produces a corresponding digital output signal. FIG. 9(b) illustrates a digital-to-analog converted (DAC) which receives digital value input and produces a corresponding analog output signal. FIGS. 9(c) and 9(d) illustrate similar circuits with frequency or rate or switching. FIG. 9(c) illustrates a frequency-to-digital converter which receives a frequency input signal and produces a corresponding digital output. FIG. 9(d) illustrates a digital-to-frequency converter which receives a digital value input and produces an output signal having a corresponding frequency. The difference between the ADC/DAC pair and the FDC/DFC pair is in the corresponding real world signal. One is analog voltage while the other is frequency. The FDC illustrated in FIG. 9(c) is a mature component. A FDC can be realized using a counter or Time-to-Digital Converter. This parallelism between ADC/DAC and FDC/DFC opens up the door to a new arena for information processing, which can possibly create a new generation of engineering miracles in electronic designs.

Most electronic systems are designed to process information. The information is first collected through the sensors which convert the information associated with real world physical phenomena into voltage or current. Then, ADC is employed to transfer the information into digital format for processing. After processing, the signal is converted back to voltage or current by a DAC to control the real world activities.

Figure 10A:
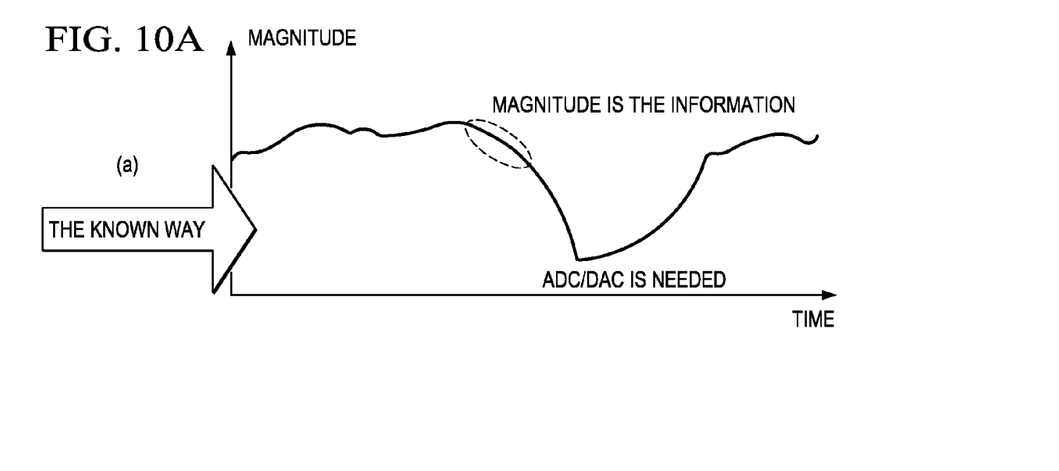
FIG. 10 illustrates a comparison of magnitude signal representation and in rate-of-switching signal representation.
Figure 10B:
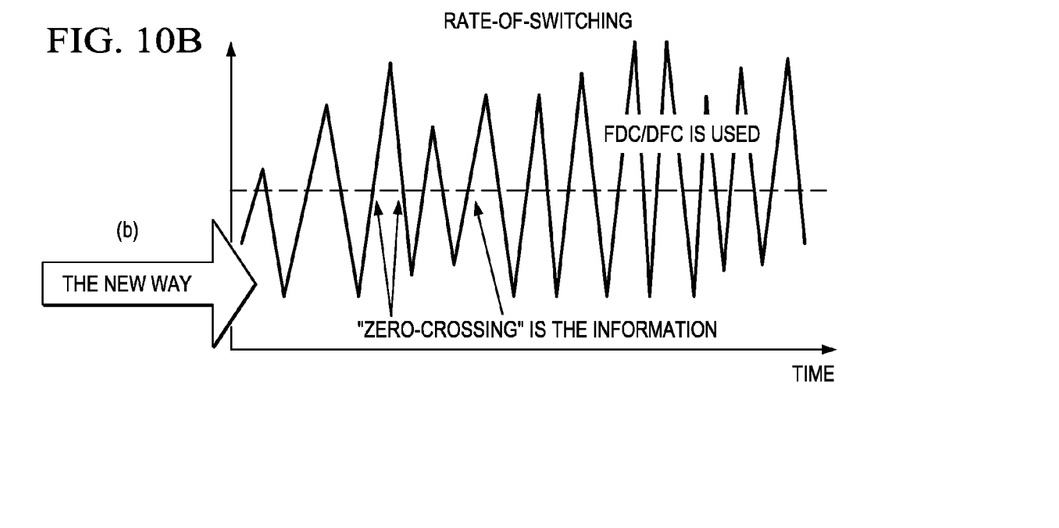

FIG. 10(a) illustrates this technique. In FIG. 10(a) the magnitude of the signal in voltage or current represents the information. ADC and DAC are the tools used to quantify this information enabling digital data processing and control or real systems. Some real world phenomena are naturally more suitable for representation in frequency or rate-of-switching of voltage or current. In the later case, the real world information is quantified in rate-of-switching rather than magnitude as illustrated in FIG. 10(b). In such cases the rate of zero-crossing in the information. In such cases, more efficient system could be built by using the DFC/FDC technique. This avoids any need for sophisticated analog components used for signal amplification, conditioning and processing.

Figure 11:
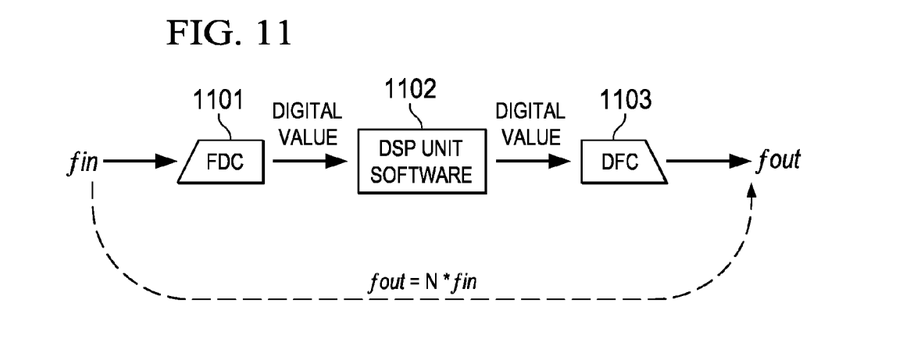
FIG. 11 illustrates a system using rate-of-signal representation depicting the significance of the digital-to-frequency converter as a circuit-level enabler.

The DFC is a circuit-level enabler for this system-level innovation. It can be utilized in two ways to help building better electronic systems. This first way is for it to be used as the clock circuitry (PLL), which is the driver of the information processing chips. The other way is to use the DFC to represent the information itself. For certain applications, this new approach could result in more efficient implementation. FIG. 11 depicts the significance of the DFC as a circuit-level enabler. The new system includes FDC 1101 constructed according to known technique converting a rate-of-switching input $f_{in}$ into a digital value. Digital signal processor (DSP) 1102 performs data processing operations on the input digital value and produces an output digital value. DFC 1103, constructed as described herein, converts this digital value into a rate-of-switching output $f_{out}$.

Utilizing the Flying-Adder's instantaneous response speed, Smart-DSP, Self-Adjust DSP (SA-DSP) or Power-Aware DSP (PA-DSP) can be created. Based on the load, DSP 1102 can adjust its operating speed (frequency) dynamically, resulting in minimum power usage. This is the so-called Dynamic Frequency Scaling (DFS). This is doable since Flying-Adder PLL has instantaneous response speed.

Unlike conventional PLL which does not have any flexibility, the Flying-Adder frequency synthesizer of this invention has superior programmability. It gives high degree of control to software programmers in the field. Involvement of software engineers generally produces innovations at the product level. Further, the software/application engineers in customer side can have the option to create their own, more differentiated, products.

What is claimed is:

1. A clock generation circuit comprising:
    a reference clock signal input for receiving a reference clock signal;
    a phase locked loop circuit connected to said reference clock signal input including
        a phase detector having a first input connected to said reference clock signal input, a second input and an output, said phase detector generating a voltage level at said output corresponding to a phase difference between signals at said first and second inputs,
        a voltage controlled oscillator generating a plurality of local clock signals having the same frequency and respective differing phases evenly distributed over one cycle, one of said plurality of local clock signals supplied to said second input of said phase detector;
    a control word input receiving an input digital control word;
    a modulation function generating a time varying digital dither signal;
    an adder having a first input receiving said input digital control word, a second input receiving said digital dither signal and an output forming a dithered control word as sum of said input digital control word and said digital dither signal;
    a flying-adder frequency synthesizer including
        a multiplexer having a plurality of inputs, a control input and an output, each of said plurality of inputs receiving a corresponding one of said plurality of local clock signals, said multiplexer selecting for output at said output a signal on one of said plurality of inputs corresponding to said control input,
        a flip-flop having a clock input connected to said output of said multiplexer and an output forming an output clock signal,
        an adder having a first input receiving said dithered control word, a second input and an output forming a sum of said first and second inputs, and
        a register for storing a multibit digital control word having an input connected to said output of said adder, a load input connected to said output of said flip-flop and an output connected to said second input of said adder, said register having an integer part of a predetermined number of most significant bits connected to said control input of said multiplexer and a fractional part.

2. The clock generator circuit of claim 1, further comprising:
    a feedback frequency divider circuit having an input receiving said one of said plurality of local clock signals and an output connected to said second input of said phase detector, said feedback frequency divider dividing the frequency of said one of said plurality of local clock signals by an integral factor N.

3. The clock generation circuit of claim 1, wherein:
    said time varying digital dither signal of said modulation function is updated at a predetermined update clock rate.

4. The clock generation circuit of claim 3, wherein:
    said predetermined update clock rate has a frequency one half said output clock signal.

5. The clock generation circuit of claim 1, wherein:
    said time varying digital dither signal of said modulation function is a random number between predetermined bounds [−r, r].

6. The clock generation circuit of claim 1, wherein:
    said time varying digital dither signal of said modulation function is a saw tooth waveform.

7. The clock generation circuit of claim 1, wherein:
    said time varying digital dither signal of said modulation function is a triangular waveform.

8. A digital data processing circuit comprising:
    an input sampling an input representing a real world physical phenomena as a rate of switching;
    a frequency to digital converting receiving said input and converting said rate of switching into a digital input value;
    a digital signal processor receiving said digital input value and producing a corresponding digital output value via data processing operations; and
    a digital to frequency converter receiving said digital output value and generating an output signal having a frequency corresponding to said digital output value including:
        a reference clock signal input for receiving a reference clock signal;
        a phase locked loop circuit connected to said reference clock signal input including
            a phase detector having a first input connected to said reference clock signal input, a second input and an output, said phase detector generating a voltage level at said output corresponding to a phase difference between signals at said first and second inputs,
            a voltage controlled oscillator generating a plurality of local clock signals having the same frequency and respective differing phases evenly distributed over one cycle, one of said plurality of local clock signals supplied to said second input of said phase detector;

a control word input receiving an input digital control word;

a modulation function generating a time varying digital dither signal;

an adder having a first input receiving said input digital control word, a second input receiving said digital dither signal and an output forming a dithered control word as sum of said input digital control word and said digital dither signal;

a flying-adder frequency synthesizer including
- a multiplexer having a plurality of inputs, a control input and an output, each of said plurality of inputs receiving a corresponding one of said plurality of local clock signals, said multiplexer selecting for output at said output a signal on one of said plurality of inputs corresponding to said control input,
- a flip-flop having a clock input connected to said output of said multiplexer and an output forming an output clock signal,
- an adder having a first input receiving said dithered control word, a second input and an output forming a sum of said first and second inputs, and
- a register for storing a multibit digital control word having an input connected to said output of said adder, a load input connected to said output of said flip-flop and an output connected to said second input of said adder, said register having an integer part of a predetermined number of most significant bits connected to said control input of said multiplexer and a fractional part.

9. The digital data processing circuit of claim 8, further comprising:
- a feedback frequency divider circuit having an input receiving said one of said plurality of local clock signals and an output connected to said second input of said phase detector, said feedback frequency divider dividing the frequency of said one of said plurality of local clock signals by an integral factor N.

10. The digital data processing circuit of claim 8, wherein:
said time varying digital dither signal of said modulation function is updated at a predetermined update clock rate.

11. The digital data processing circuit of claim 10, wherein:
said predetermined update clock rate has a frequency one half said output clock signal.

12. The digital data processing circuit of claim 8, wherein:
said time varying digital dither signal of said modulation function is a random number between predetermined bounds [−r, r].

13. The digital data processing circuit of claim 8, wherein:
said time varying digital dither signal of said modulation function is a saw tooth waveform.

14. The digital data processing circuit of claim 8, wherein:
said time varying digital dither signal of said modulation function is a triangular waveform.

* * * * *